(12) United States Patent
Shin

(10) Patent No.: US 7,869,164 B2
(45) Date of Patent: Jan. 11, 2011

(54) FLEXIBLE PRINTED CIRCUIT BOARD HAVING CRACK-PREVENTING FEATURES BETWEEN STATIC AND DYNAMIC REGIONS, AND HARD DISK DRIVE EMPLOYING THE SAME

(75) Inventor: Sang-chul Shin, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 955 days.

(21) Appl. No.: 11/730,199

(22) Filed: Mar. 30, 2007

(65) Prior Publication Data

US 2007/0227768 A1    Oct. 4, 2007

(30) Foreign Application Priority Data

Mar. 31, 2006  (KR) .................. 10-2006-0029817

(51) Int. Cl.
*G11B 5/55*    (2006.01)
(52) U.S. Cl. .................. 360/264.2; 360/266.3
(58) Field of Classification Search .......... 360/264.2, 360/266.3, 245.8–246
See application file for complete search history.

(56) References Cited

U.S. PATENT DOCUMENTS

| | | | |
|---|---|---|---|
| 2,951,112 A | 8/1960 | Dahlgren | |
| 4,832,621 A | 5/1989 | Asai et al. | |
| 5,981,870 A | 11/1999 | Barcley et al. | |
| 6,099,745 A | 8/2000 | McKenney et al. | |
| 6,388,883 B1 | 5/2002 | Serizawa et al. | |
| 6,452,754 B1 * | 9/2002 | Mizuta et al. | 360/266.3 |
| 7,616,408 B2 * | 11/2009 | Choi et al. | 360/264.2 |
| 2003/0235012 A1 | 12/2003 | Nishizawa | |

FOREIGN PATENT DOCUMENTS

| | | |
|---|---|---|
| EP | 0789352 A1 | 8/1997 |
| EP | 1308933 A2 | 5/2003 |
| JP | 05-259588 | 10/1993 |
| JP | 06-326426 | 11/1994 |
| JP | 09-081923 | 3/1997 |
| JP | 2000-030233 | 1/2000 |
| JP | 2001-332820 | 11/2001 |
| KR | 1020030037569 A | 5/2003 |

* cited by examiner

*Primary Examiner*—A. J. Heinz
(74) *Attorney, Agent, or Firm*—Volentine & Whitt, PLLC

(57) ABSTRACT

A flexible printed circuit board has a flexible dynamic region, and relatively rigid static regions between which the dynamic region extends. Portions of a base layer, a patterned conductive layer extending on the base layer, and a cover layer covering the conductive layer make up the dynamic region. Extensions of the base layer, the conductive layer, and the cover layer, and portions of a metal layer to which the base layer is attached make up each of the static regions. The metal layer enhances the rigidity of the flexible printed circuit board at the static regions. The metal layer also has rounded corners at sides of each of the boundaries between the dynamic region and each of the static regions to minimize stress concentrations at the boundaries. The conductive layer is made up of real traces through which electrical signals are transmitted, and dummy traces. The dummy traces are disposed outwardly of the real traces to prevent the flexible printed circuit board from cracking at the boundaries between the dynamic region and each of the static regions. In an HDD, the flexible printed circuit board electrically connects a head stack assembly (HSA) and a main circuit board.

20 Claims, 13 Drawing Sheets

FLEXIBLE PRINTED CIRCUIT BOARD HAVING CRACK-PREVENTING FEATURES BETWEEN STATIC AND DYNAMIC REGIONS, AND HARD DISK DRIVE EMPLOYING THE SAME

BACKGROUND OF THE INVENTION

1. Field of the Invention

The present invention relates to a hard disk drive (HDD). More particularly, the present invention relates to a flexible printed circuit board through which electrical signals are exchanged between a head stack assembly (HSA) and a main circuit board in an HDD, and to an HDD employing such a flexible printed circuit board.

2. Description of the Related Art

Hard disk drives (HDDs) are used as auxiliary memory devices for computers, MP3 players, mobile phones, and the like to read data stored on a data storage disk or to write new data onto the disk using a head slider. In particular, a magnetic head disposed on a head slider reads data stored on the data or writes new data onto the disk while the head slider floats the magnetic head above the disk. The head slider is attached to a front end of a head stack assembly (HSA), and the HSA is pivotable to move the head slider to a predetermined position over the disk to begin a read or write operation. In this respect, the HSA is electrically connected to a main circuit board by means of a flexible printed circuit board so as to receive signals that control its movement over the disk.

FIG. 1 is a plan view of a conventional flexible printed circuit board 10 used in an HDD.

Referring to FIG. 1, the conventional flexible printed circuit board 10 includes a conductive layer 24 forming a circuit pattern and through which electrical signals are transmitted, a sealing layer 22 insulating and sealing the conductive layer 24, and a metal layer 20 enhancing the rigidity of the flexible printed circuit board 10 at opposite ends thereof. Therefore, the conventional flexible printed circuit board 10 has static regions 15 and 20 consisting of the conductive layer 24, the sealing layer 22, and the metal layer 20, and a dynamic region 12 consisting of the conductive layer 24 and the sealing layer 22. The static region 15 is coupled to an HSA (not shown) so as to communicate with the HSA. The other static region 20 is coupled to a main circuit board (not shown) so as to communicate with the main circuit board. The dynamic region 12 flexes between the static regions 15 and 20 as the HSA is pivoted. Thus, the dynamic region 12 is repeatedly bent and straightened in response to the movement of the HSA.

The repeated bending and straightening of the dynamic region 12 of the flexible printed circuit board 10 causes stress concentrations and fatigue at boundaries i and ii between the dynamic region 12 and each of the static regions 15 and 20. As a result, the sealing layer 22 cracks, and the cracks propagate through the sealing layer 22. Ultimately, the conductive layer 24 is damaged due to the cracking of the sealing layer 22.

SUMMARY OF THE INVENTION

An object of the present invention is to provide a flexible printed circuit board in which cracks are unlikely to form in the sealing layer at the boundaries between its dynamic region and its static regions.

A more specific object of the present invention is to provide a flexible printed circuit that minimizes stress concentrations at the boundaries between its dynamic region and its static regions.

Another more specific object of the present invention is to provide a flexible printed circuit that minimizes fatiguing of the sealing layer thereof especially at the boundaries between its dynamic region and its static regions.

Still another object of the present invention is to provide an HDD having a main circuit board, a head stack assembly (HSA), and a flexible printed circuit board connecting the HSA and the main printed circuit board, and in which the flexible printed circuit board has a long useful life so as not to adversely impact the operation of the HSA even after many cycles of operation.

According to an aspect of the present invention, there is provided a flexible printed circuit board having a flexible dynamic region, and relatively rigid static regions between which the dynamic region extends, and in which dummy traces span the boundaries between the dynamic region and each of the static regions. The dynamic region is made up of respective first portions of a conductive layer and a sealing layer. Preferably, the sealing layer is of photosensitive polyimide. The static regions are each made up of respective extensions of the first portions of the conductive layer and the sealing layer, and a respective portion of a metal layer. The metal layer enhances the rigidity of the flexible printed circuit board at the static regions thereof. Preferably, the metal layer may be of stainless steel. The dynamic region is devoid of the metal layer and is thus more flexible than either of the static regions. The conductive layer includes a set of real traces through which electrical signals are transmitted by the flexible printed circuit board, and the dummy traces. The dummy traces are disposed to the sides of the set of real traces.

According to another aspect of the present invention, there is provided an HDD in which the flexible printed circuit board electrically connects a main circuit board and a head stack assembly (HSA). According to this aspect of the present invention, electrical signals are transmitted between the main circuit board and the HSA via the real traces. On the other hand, no electrical signals are transmitted via the dummy traces in the HDD as the dummy traces do not electrically connect the main circuit board and the HSA.

The dummy traces have ends that terminate adjacent the boundaries between the dynamic region and each of the static regions, and the ends have no pads by which the dummy traces can be connected to external devices. The dummy traces may each be in the form of a dashed line that spans the dynamic region. Alternatively, the dummy traces may each be in the form of a contiguous line that spans the dynamic region.

According to another aspect of the present invention, there is provided a flexible printed circuit board having a flexible dynamic region, and relatively rigid static regions between which the dynamic region extends, and in which stress concentrations at the boundaries between the dynamic region and each of the static regions are minimized. Portions of a base layer, a patterned conductive layer extending on the base layer, and a cover layer covering the conductive layer make up the dynamic region. Extensions of the base layer, the conductive layer, and the cover layer, and portions of the metal layer to which the base layer is attached make up each of the static regions. The metal layer enhances the rigidity of the flexible printed circuit board at the static regions. The metal layer has rounded corners at sides of each of the boundaries to thereby minimize stress concentrations at the boundaries.

According to still another aspect of the present invention, there is provided an HDD in which the flexible printed circuit board, whose metal layer has rounded corners at sides of each of the boundaries between the dynamic region and each of the static regions, electrically connects a main circuit board and a head stack assembly (HSA).

The metal layer may also have linear edges spanning the curved corners at the sides of the boundaries, respectively. Alternatively, the metal layer may have curved edges spanning the curved corners at the sides of the boundaries, respectively. Each of the curved edges may define a concavity in the metal layer at one of the boundaries or a convexity at one of the boundaries. In another embodiment, the metal layer may have undulating edges spanning the curved corners at the sides of the boundaries, respectively. In yet another embodiment, the metal layer has recesses in peripheral edge portions thereof, the recesses spanning the curved corners at the sides of the boundaries, respectively.

BRIEF DESCRIPTION OF THE DRAWINGS

The above and other object, features and advantages of the present invention will become more apparent from the following detailed description of the preferred embodiments thereof made with reference to the attached drawings in which.

DETAILED DESCRIPTION OF THE PREFERRED EMBODIMENTS

The present invention will now be described more fully with reference to FIGS. 2-15, in which preferred embodiments of the invention are shown.

Figure 2:
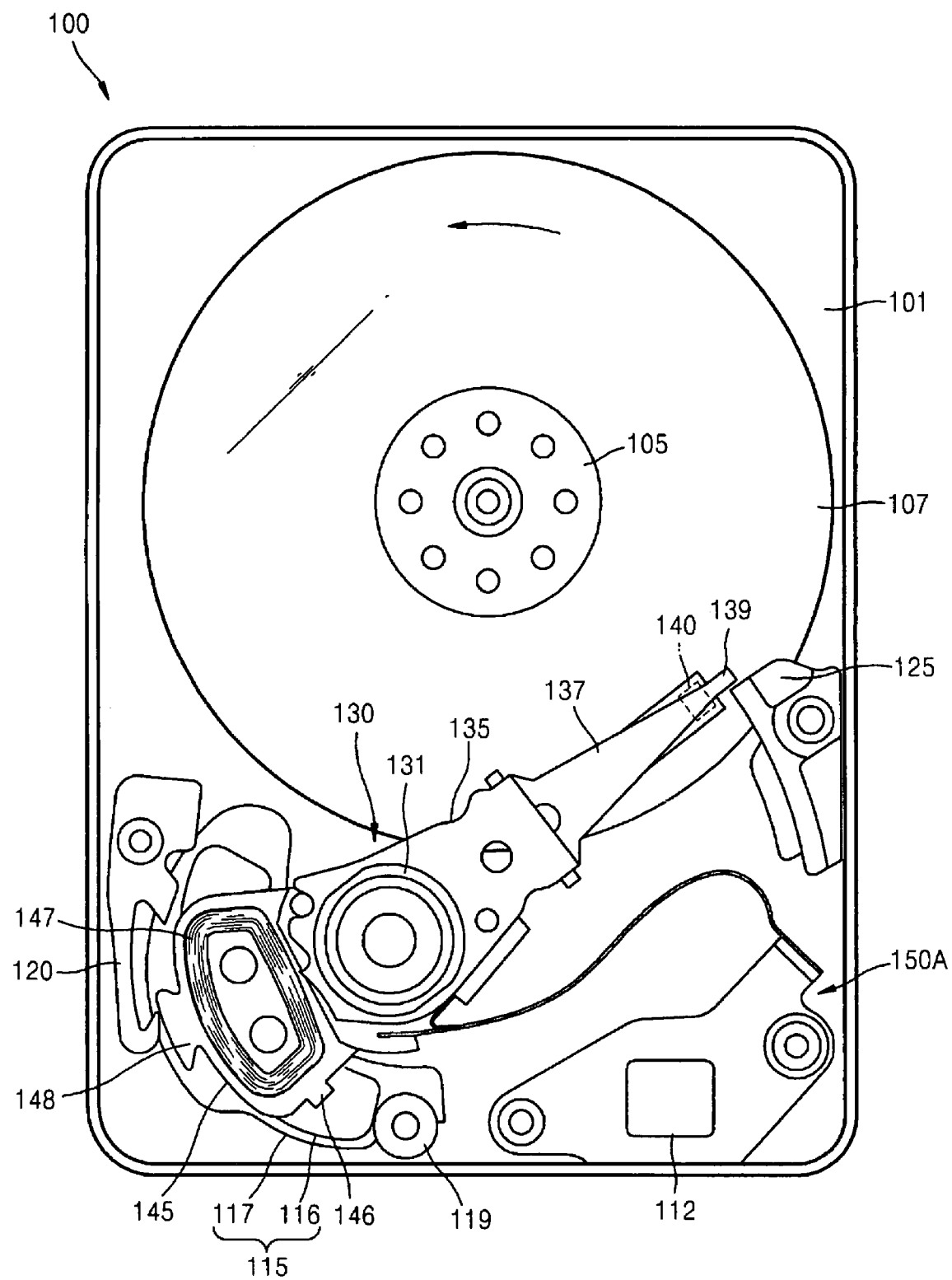
FIG. 2 is a plan view of an embodiment of an HDD according to the present invention.

Referring first to FIG. 2, a first embodiment of an HDD 100 according to the present invention includes a housing having a base 101 and a cover (not shown) coupled to the base 101, a spindle motor 105, a data storage disk 107 coupled to the spindle motor 105, a head stack assembly (HSA) 130, and a voice coil motor (VCM) block 115. The base 101, the spindle motor 105, the data storage disk 107, the HSA 130, and the VCM block 115 are disposed in the housing. The spindle motor 105 is fixed to the base 101. The disk 107 is rotated at a high speed in the direction of the arrow by the spindle motor 105, and the high-speed rotation of the disk 107 generates airflow in the direction of the arrow above a surface of the disk 107.

The HSA 130 includes a head slider 140 having a magnetic head (not shown) for writing or reading data. The head slider 140 is moved to a predetermined position over the disk 107, namely, is moved over a track of the disk 107, to write or read data onto or from the disk 107. To this end, the HSA 130 includes a swing arm 135 mounted on the base 101 via a pivot 131, a suspension 137 coupled to a front end of the swing arm 135, and a coil support 145 extending from the pivot 131 in a direction opposite to the swing arm 135. A voice coil 147 is wound around the coil support 145. The suspension 137 has an end-tab 139 at a front end thereof. The head slider 140 is mounted to the front end of the suspension 137 behind the end tab 139. The suspension 137 biases the head slider 140 toward the disk 107.

The VCM block 115 is mounted to the base 101, and the coil support 145 extends into the VCM block 115. The VCM block 115 includes magnets 116 disposed above and below the coil support 145, and a yoke 117 supporting the magnets 116. An electromagnetic force is generated by the voice coil 147 and the magnets 116 when current is supplied to the voice coil 147. The electromagnetic force pivots the HSA 130 and, more specifically, the swing arm 135 of the HSA 130, about pivot 131. The supplying of current to the voice coil 147, and hence, the pivoting of the HSA 130, is controlled by a servo control system.

In this respect, the HSA 130 is electrically connected to a flexible printed circuit board 150A. The flexible printed circuit board 150A is, in turn, connected to a main circuit board (not shown) disposed under the base 101. The flexible printed circuit board 150A transfers electrical signals between the HSA 130 and the main circuit board. The main circuit board thus controls the operation of the HSA 130. Reference numeral 112 denotes a pre-amplifier for amplifying electrical signals transferred via the flexible printed circuit board 150A. The spindle motor 105 is also connected to and controlled by the main circuit board.

A lifting force is exerted on the head slider 140 when the head slider 140 is positioned over the disk 107 and the disk 107 is rotated by the spindle motor 105 at a high speed, because the airflow generated due to the high-speed rotation of the disk 107 passes between the disk 107 and the head slider 140. The head slider 140 is raised above the surface of the disk 107 by the lifting force and floats in position when the lifting force becomes equal to the biasing force (elasticity) of the suspension 137. The magnetic head mounted on the head slider 140 writes or reads data onto or from the disk 107 while the head slider 140 is in this floating state.

When the HDD 100 is turned off, the head slider 140 is moved off of the disk 107. At this time, the end-tab 139 slides onto a ramp 125 disposed radially outwardly of the disk 107 to park the magnetic head. Also, when the magnetic head is parked, a latch 120 engages a hook 148 on the coil support 145 to lock the HSA 130 in place. As a result, the ramp 125 and the latch 120 prevent the head slider 140, the magnetic head and the disk 107 from being damaged while the HDD 100 is not operating.

In addition, the HDD 100 includes a crash stopper 119 that limits the range of counterclockwise rotation of the swing arm 135 of the HSA 130. More specifically, in addition to the hook 148, the coil support 145 includes a protrusion at one side thereof. The HSA 130 is stopped mechanically when the protrusion 146 collides with the crash stopper 119. Accordingly, the HSA 130 and the spindle motor 105 are prevented from colliding with each other when a shock of a fairly large magnitude is exerted on the HDD.

Figure 3:
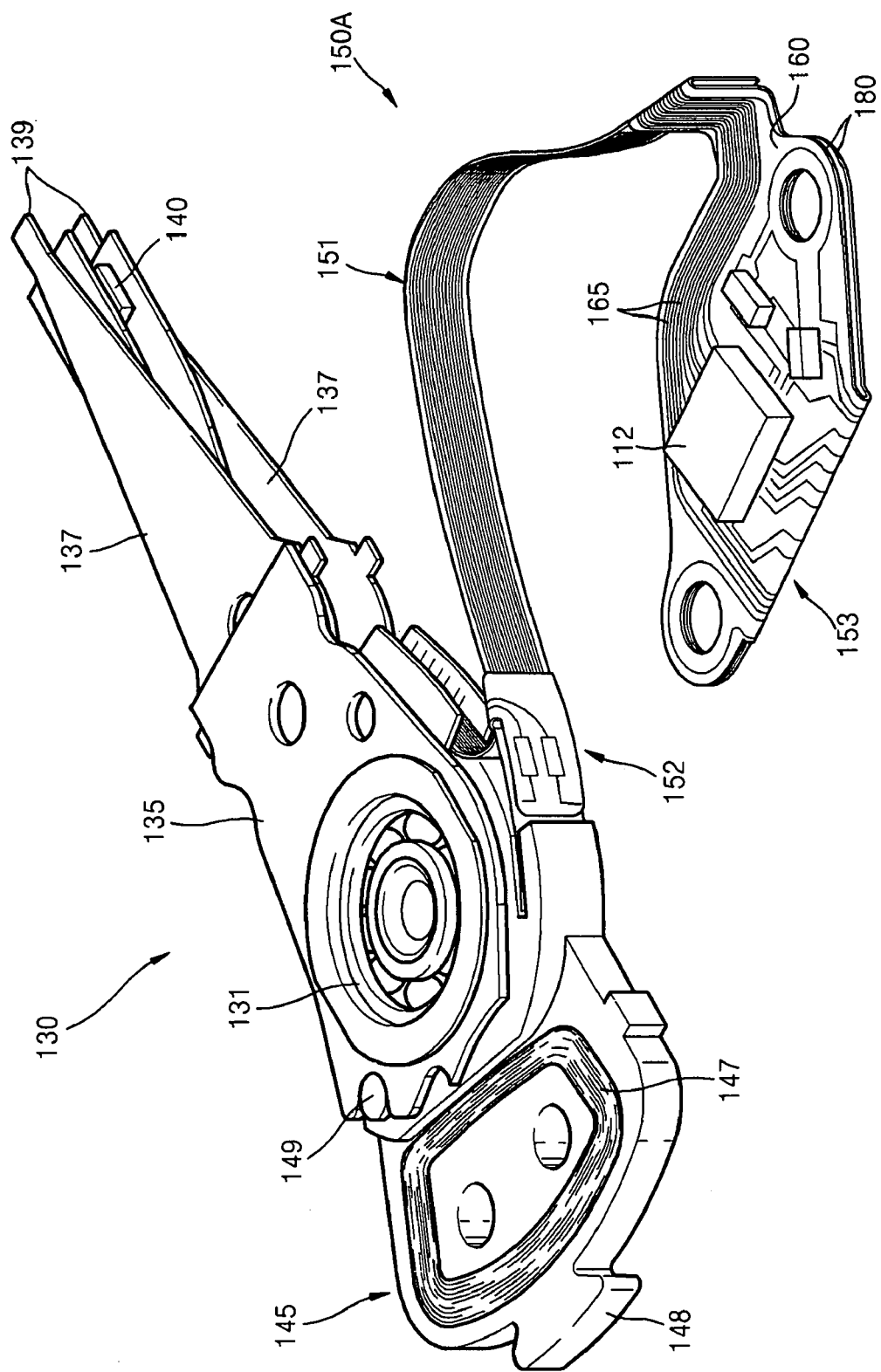
FIG. 3 is a perspective view of a head stack assembly (HSA) and a flexible printed circuit board of the HDD of FIG. 2.

Referring to FIG. 3, the HSA 130 may be a so-called unimount type of HSA having a pair of stacked blades each constituted by a swing arm 135, a suspension 137, and a head slider 140. The coil support 145 is interposed between the blades. The unimount type of HSA is often adopted by small HDDs having sub-2.5 inch disks.

Figure 4:
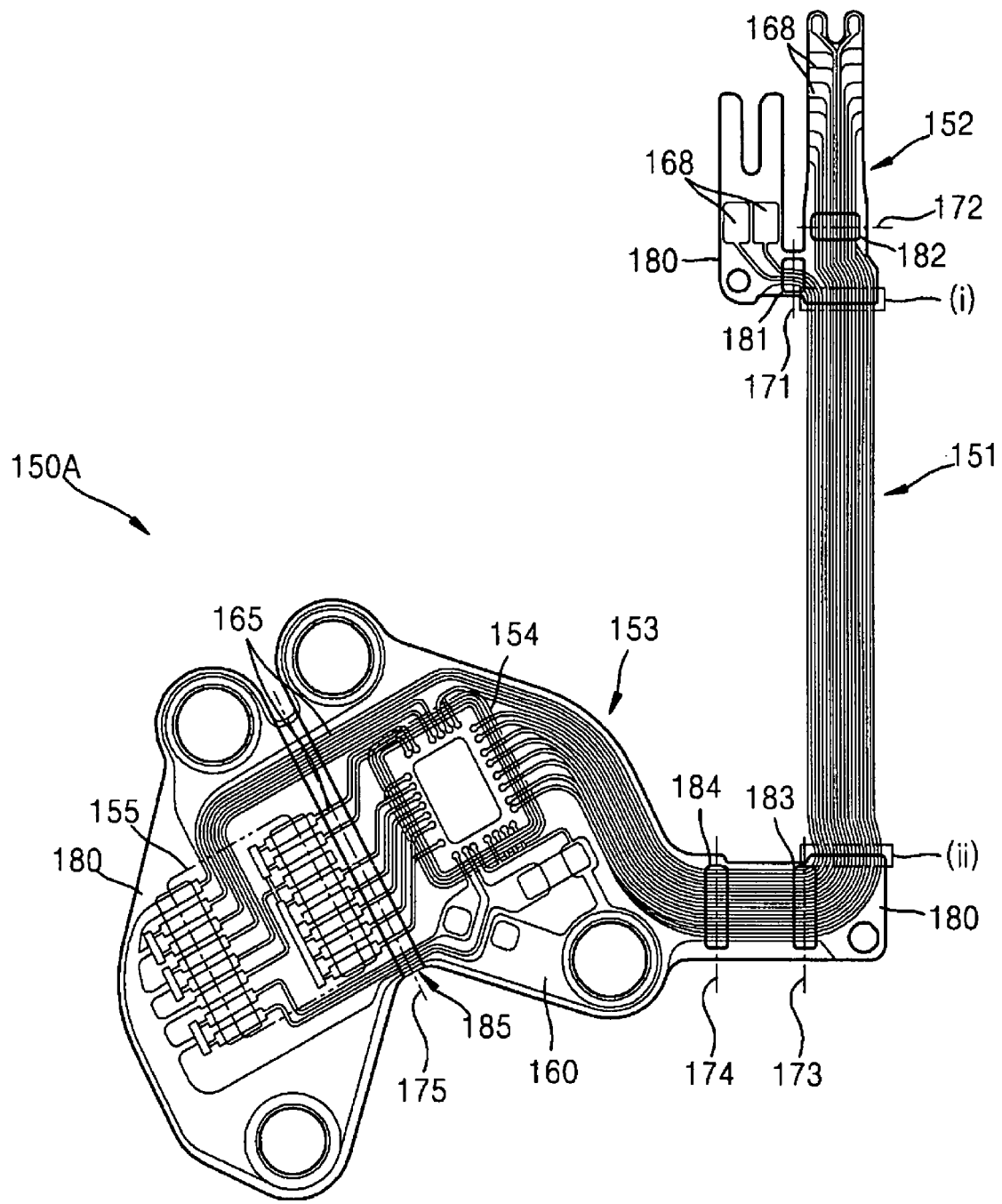
FIG. 4 is a plan view of an embodiment of a flexible printed circuit board according to the present invention.

Referring to FIGS. 3 and 4, the flexible printed circuit board 150A has an HSA-side static region 152 at which the flexible printed circuit board 150A is coupled to the HSA 130 so as to communicate with the HSA 130, a main circuit board-side static region 153 at which the flexible printed circuit board 150A is coupled to the main circuit board so as to communicate with the main circuit board, and a dynamic region 151 disposed between the static regions 152 and 153. The flexible printed circuit board 150A is repeatedly bent and straightened at the dynamic region 151 in response to the pivoting of the HSA 130. The dynamic region 151 includes portions of a conductive layer 165 in the form of a circuit pattern through which electrical signals are transmitted, and of a sealing layer 160 insulating and sealing the conductive layer 165. Each of the static regions 152 and 153 includes extensions of the conductive layer 165 and the sealing layer 160, and also includes a metal layer 180 disposed under the sealing layer 160 to enhance the rigidity of the flexible printed circuit 150A board at the static regions 152 and 153.

Figure 5:
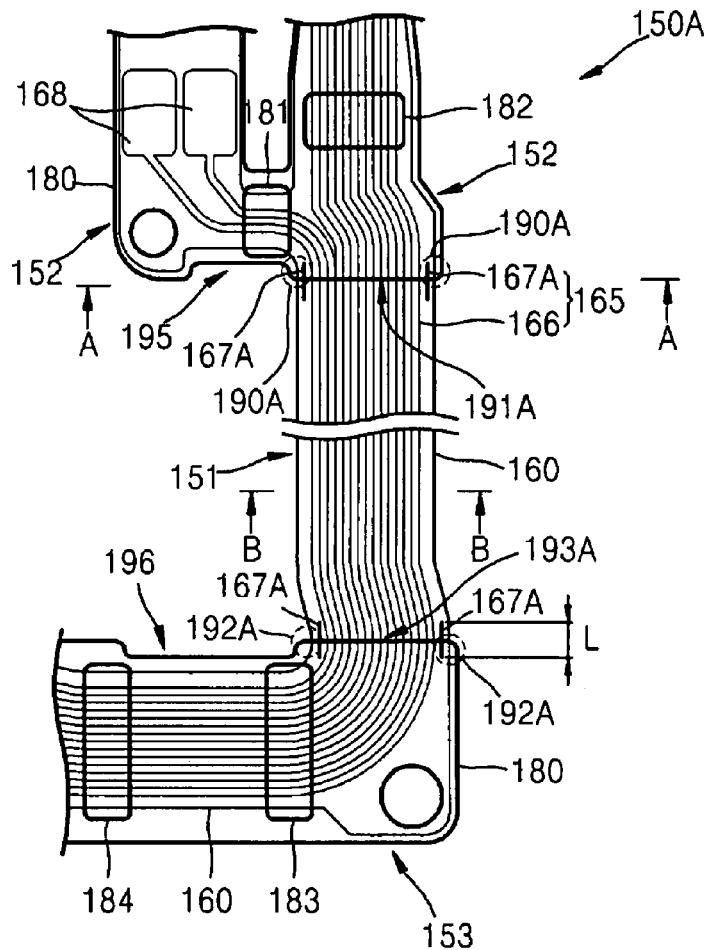
FIG. 5 is an enlarged view of part of the flexible printed circuit board of FIG. 4.
Figure 6:
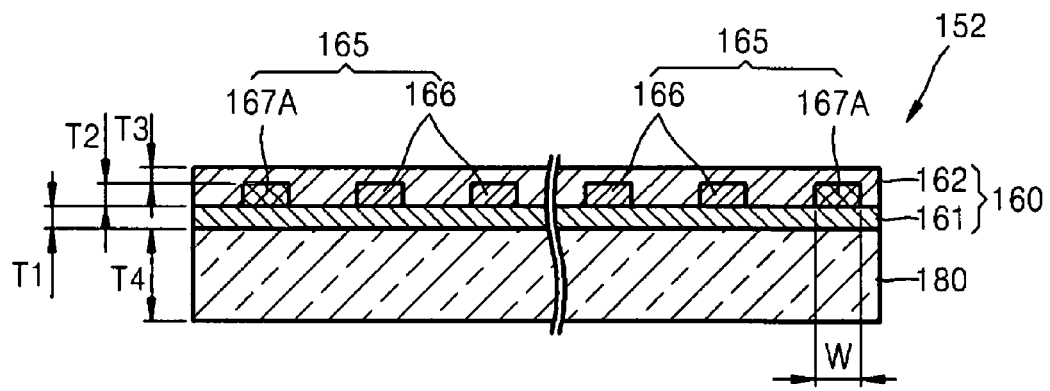
FIG. 6 is a cross-sectional view taken along line A-A of FIG. 5.
Figure 7:
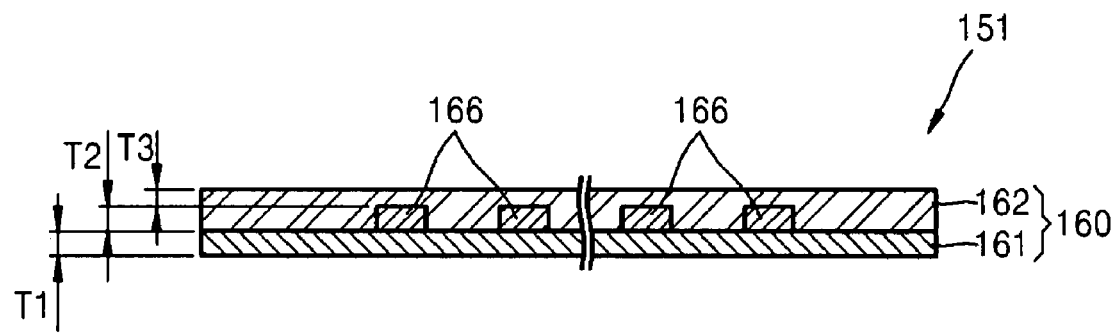
FIG. 7 is a cross-sectional view taken along line B-B of FIG. 5.

Referring to FIGS. 5-7, the sealing layer 160 includes a base lamina 161 disposed under the conductive layer 165, and a cover lamina 162 covering the conductive layer 165 to prevent the conductive layer 165 from being short-circuited. The cover lamina 162 is juxtaposed with the base lamina 161 such that the conductive layer 165 is sandwiched therebetween. In the case of a small HDD, the base lamina 161 is formed by depositing photosensitive polyimide on a metal film, the conductive layer 165 is formed by plating or depositing copper (Cu) or a copper alloy on the base lamina 161, and the cover lamina 162 is formed by depositing photosensitive polyimide on the conductive layer 165 and base lamina 161. A portion of the metal film is then removed from the dynamic region 151 (see FIG. 4) by an etching process, whereby the remaining portion constitutes metal layer 180.

The metal film used to form the metal layer 180 may be a film of stainless steel that can shield electromagnetic interference (EMI) and can facilitate the deposition of photosensitive polyimide. The film of stainless steel may have a thickness T4 of approximately 50 μm so as to be easily etched and so that the resulting metal layer 180 nonetheless imparts sufficient rigidity to the static regions 152, 153. Also, in the case of a small HDD, the base lamina 161 may have a thickness T1 of approximately 10 μm at one side of the conductive layer 165, the conductive layer 165 may have a thickness T2 of approximately 10 to 12 μm, and the cover lamina 162 may have a thickness T3 of approximately 5 to 7 μm as measured from the other side of the conductive layer 65. A simulation revealed that that only small amounts of stress will be applied to the dynamic region 151 (see FIG. 5) when the thickness T1 of the base lamina 161 is 10 μm, the thickness T2 of the conductive layer 165 is 10 μm, and the thickness T3 of the cover lamina 162 is 5 μm. More preferably, the base lamina 161, the conductive layer 165, and the cover lamina 162 may be formed so that the thickness T1 of the base lamina 161 and the thickness T3 of the cover lamina 162 are similar to each other as measured from opposite sides of the conductive layer 165, respectively. In this respect, the cover lamina 162 of photosensitive polyimide may be formed by two or three discrete deposition processes to prevent bubbles from being produced in the cover lamina 162.

Alternatively, the sealing layer 160 may be formed by bonding polyimide films to one another. In this case, the metal layer 180 may be formed by bonding discrete metal films under the base layer 161 in the static regions 152 and 153, respectively.

Referring again to FIG. 4, the HSA-side static region 152 is bent along alternating lines 171 and 172 to facilitate, its coupling to the HSA 130 (see FIG. 3 as well). In this respect, grooves 181 and 182 are formed in the metal layer 180 at the static region 152 so that the flexible printed circuit board can be bent easily at the static region 152 thereof. The main circuit board-side static region 153 is bent along lines 173, 174, and 175 to facilitate its mounting to the base 101 (FIG. 2) and its coupling to the main circuit board. In this respect, grooves 183 and 184 and 185 are formed in the metal layer 180 at the static region 153 so that the flexible printed circuit board can be bent easily at the static region 153 thereof.

Reference numeral 154 denotes a pre-amplifier site on which the pre-amplifier 112 is to be mounted, and reference numeral 155 denotes a connector site on which a connector (not shown) connected to the main circuit board is to be mounted. Also, reference numeral 168 denotes soldering pads bonded to terminals (not shown) of the HSA 130 by soldering.

The flexible printed circuit board also has features for preventing cracks from occurring at the boundary i between the HSA-side static region 152 and the dynamic region 151 and at the boundary ii between the main circuit board-side static region 153 and the dynamic region 151. These features will now be described below.

Referring to FIGS. 4 through 7, the conductive layer 165 of the flexible printed circuit board 150A includes real traces 166 through which electrical signals are transmitted, and dummy traces 167A formed at the boundaries i and ii outside the real traces 166. That is, the dummy traces 167A are closer to the outer peripheral edges of the sealing layer 160 than the real traces 166 are, and cross over the boundaries I and ii onto the metal layer 180 at each of the static regions 152 and 153. The dummy traces 167A have terminal ends adjacent the boundaries i and ii.

The dummy traces 167A are made of copper (Cu) or a copper alloy, as constituting the conductive layer 165, and thus have a greater rigidity than the sealing layer 160. Therefore, the dummy traces 167A can prevent cracks from propagating from outer peripheral edges of the sealing layer 160 to a middle portion of the sealing layer 160 as the dynamic region 151 of the flexible printed circuit board 150A is continuously bent and straightened while the HDD 100 is in use. In the present embodiment, such cracks can be effectively prevented from growing when the dummy traces 167A have a width W (see FIG. 6) of approximately 30 μm and a length L (see FIG. 5) of approximately 250 μm. The dummy traces 167A can additionally function to absorb electrostatic discharge (ESD) generated by the flexible printed circuit 150A during the operation of the HDD 100.

Linear edges 191A and 193A of the metal layer 180 delimit the boundaries i and ii, respectively, between the dynamic region 151 and the static regions 152 and 153. The metal layer 180 also has rounded corners 190A, 192A at the sides of each of the edges and hence, at the sides of the boundaries i and ii to minimize stress concentrations. Also, the metal layer 180 has recesses 195 and 196 in the periphery thereof in both the HSA-side static region 152 and in the main circuit board-side static region 153. The recesses 195 and 196 are directly adjacent lower ones of the corners 190A, 192A, respectively (FGIS. 2 and 3). The recesses 195 and 196 thus extend across the boundaries i and ii (when the static regions 152 and 153 are bent about 171 and 173, respectively).

FIGS. 8 through 12 are partial plan views of other embodiments of flexible printed circuit boards 150B, 150C, 150D, 150E, and 150F according to the present invention. Elements and features of the flexible printed circuit boards 150B through 150F which are the same as those of the flexible printed circuit board. 150A are designated by the same reference numerals and thus, will not be described in further detail.

Figure 8:
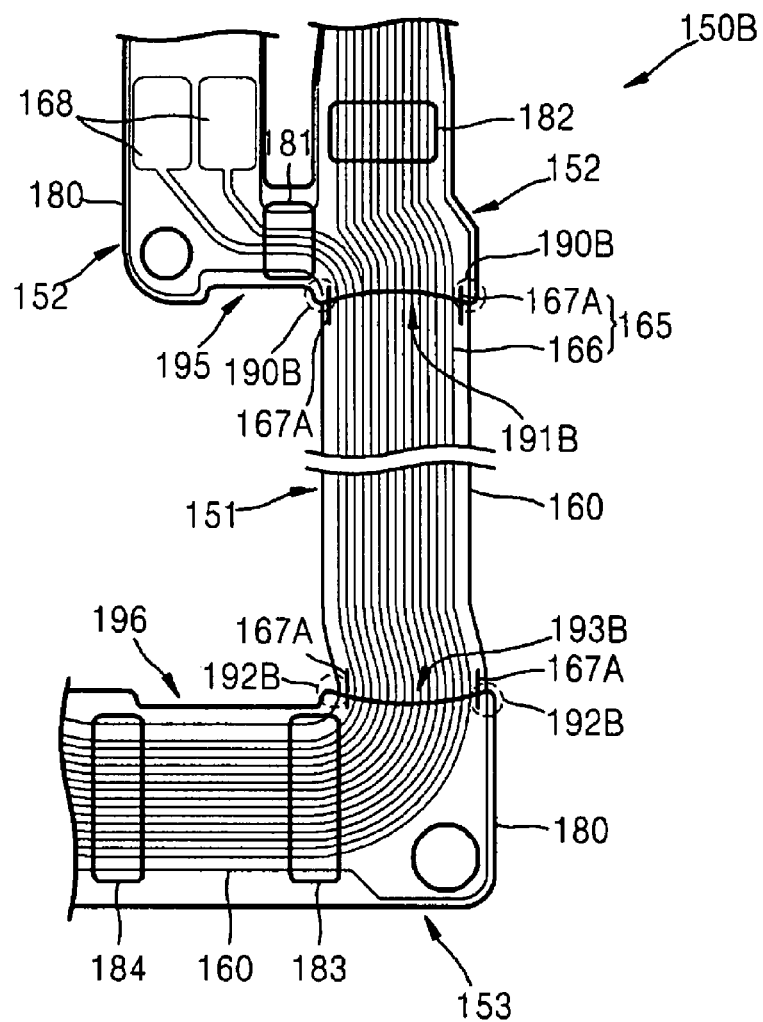
FIGS. 8 through 12 are plan views of portions of other embodiments of flexible printed circuit boards according to the present invention, respectively.

Referring to FIG. 8, curved edges of the metal layer 180 delimit the boundaries i and ii, respectively, between the dynamic region 151 and the static regions 152 and 153. The edges form concavities 191B and 193B in the metal layer 180 at the boundaries i and ii, respectively. Each concavity 191B, 193B is thus juxtaposed with a recess 195,196 (when the static regions 152 and 153 are bent about 182 and 183, respectively). The metal layer 180 also has rounded corners 190B, 192B at the sides of the boundaries I and ii to minimize stress concentrations at the boundaries I and ii.

Figure 9:
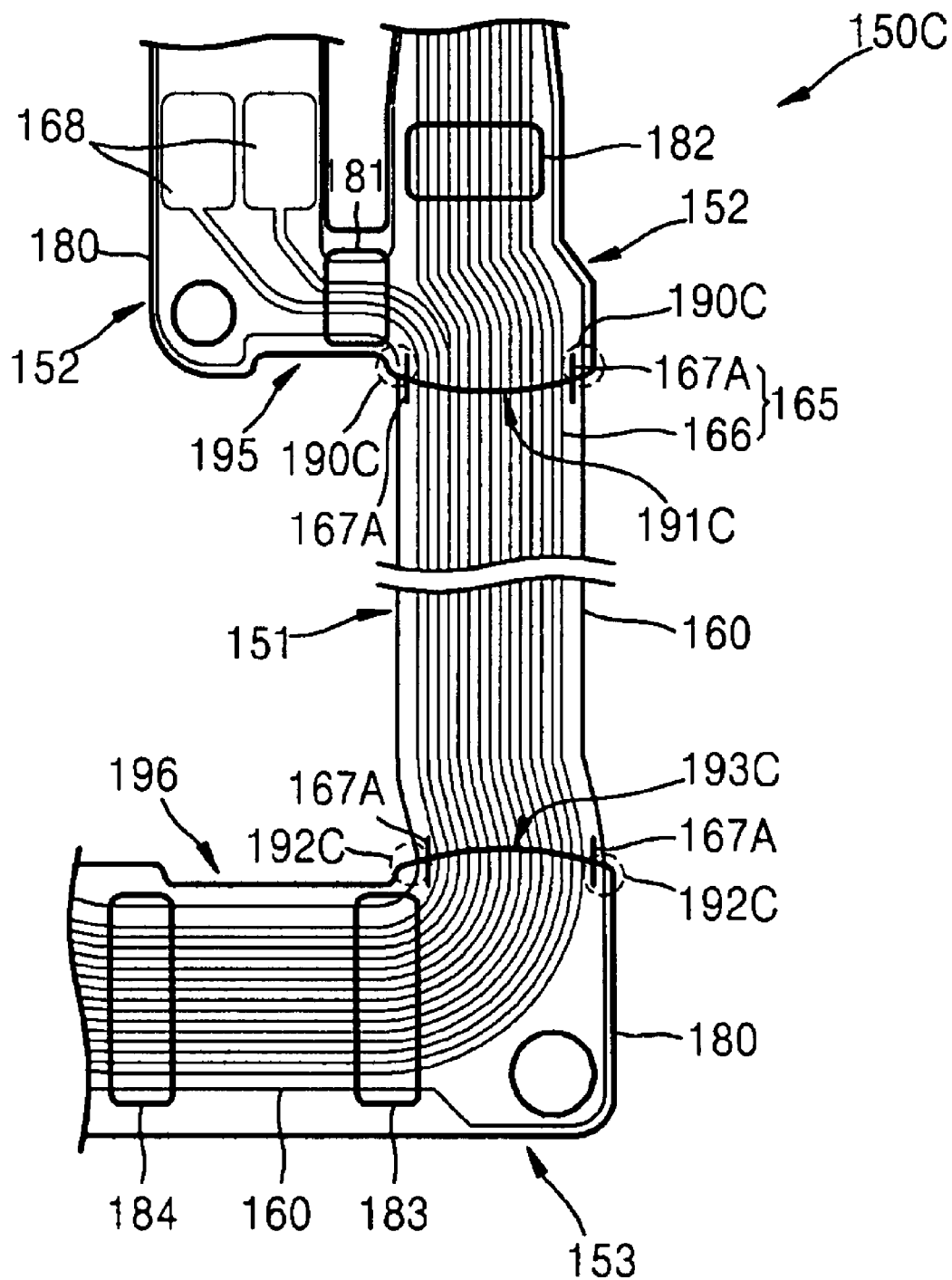

Referring to FIG. 9, curved edges of the metal layer 180 delimit the boundaries i and ii, respectively, between the dynamic region 151 and the static regions 152 and 153. The edges form convexities 191B and 193B in the metal layer 180 at the boundaries i and ii, respectively. Each convexity 191C, 193C is thus juxtaposed with a recess 195,196 (when the static regions 152 and 153 are bent about 182 and 183, respectively). The metal layer 180 also has rounded corners 190C, 192C at the sides of the boundaries i and ii to minimize stress concentrations at the boundaries i and ii.

Figure 10:
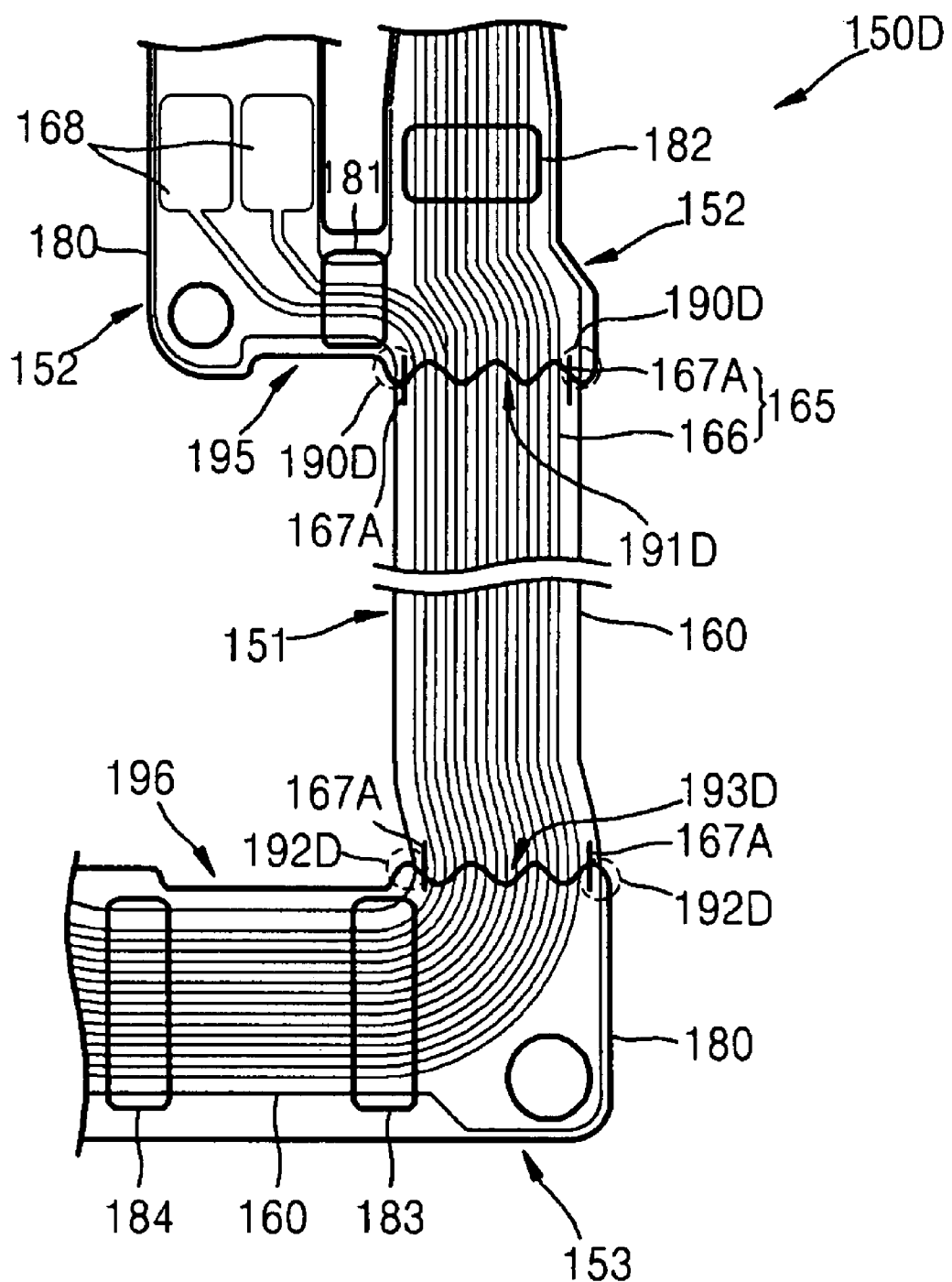

Referring to FIG. 10, undulating edges of the metal layer 180 delimit the boundaries i and ii, respectively, between the dynamic region 151 and the static regions 152 and 153. The edges form undulations 191D and 193D in the metal layer 180 at the boundaries i and ii, respectively. Each undulating edge 191D, 193D is thus juxtaposed with a recess 195,196 (when the static regions 152 and 153 are bent about 182 and 183, respectively). The metal layer 180 also has rounded corners 190D, 192D at the sides of the boundaries i and ii to minimize stress concentrations at the boundaries i and ii.

Figure 11:
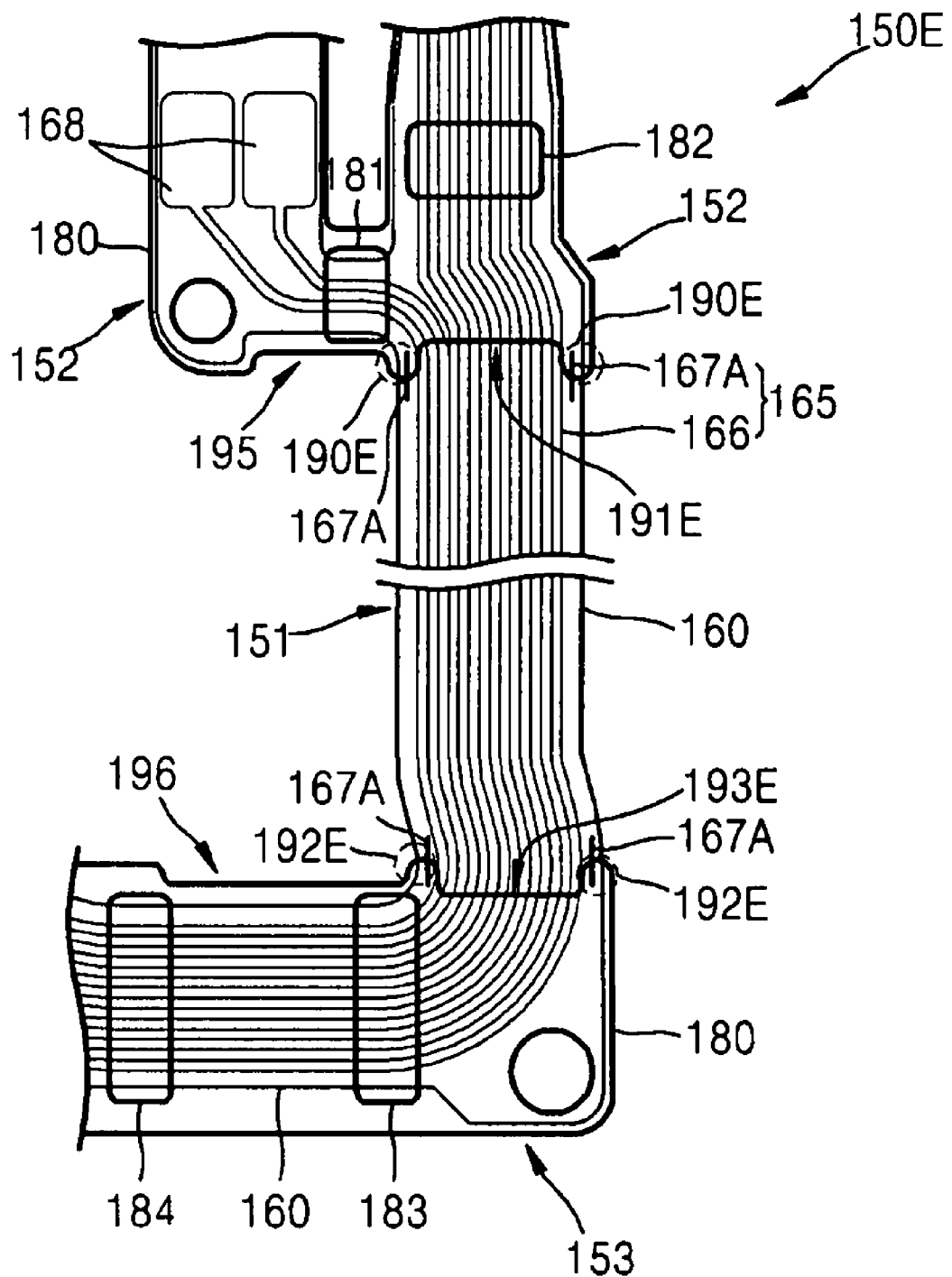

Referring to FIG. 11, linear edges of the metal layer 180 delimit the boundaries i and ii, respectively, between the dynamic region 151 and the static regions 152 and 153. The edges are at the bottom of recesses 191E and 193E in the metal layer 180 at the boundaries i and ii, respectively. Each recess 191 E, 193E is thus juxtaposed with a recess 195,196 (when the static regions 152 and 153 are bent about 182 and 183, respectively). The metal layer 180 also has rounded corners 190E, 192E at the sides of the boundaries i and ii to minimize stress concentrations at the boundaries i and ii.

Figure 12:
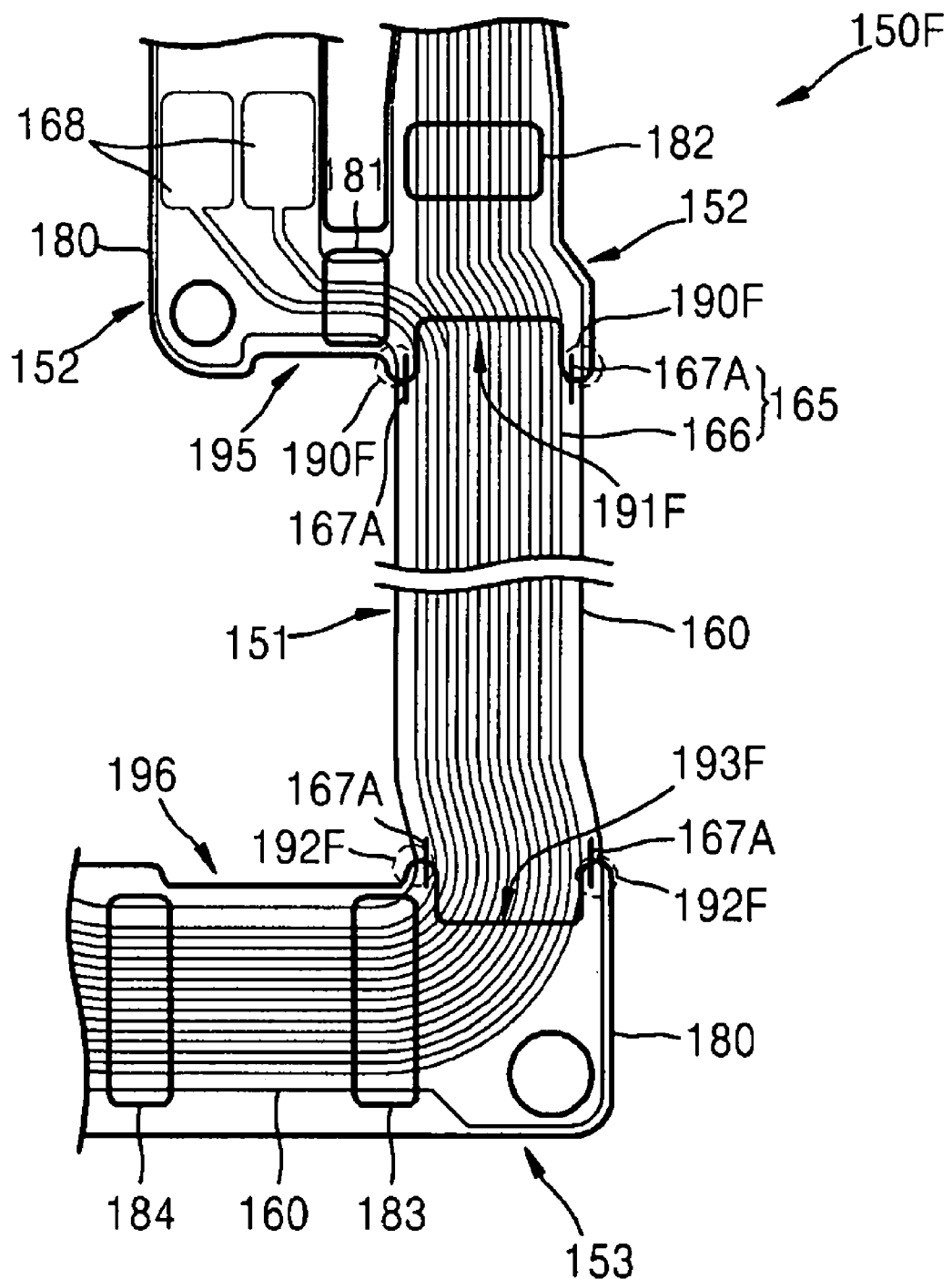

Referring to FIG. 12, linear edges of the metal layer 180 delimit the boundaries i and ii, respectively, between the dynamic region 151 and the static regions 152 and 153. The edges are at the bottom of recesses 191 F and 193F in the metal layer 180 at the boundaries i and ii, respectively. The recesses 191 F and 193F are deeper than the adjoining recesses 195 and 196, respectively. The metal layer 180 also has rounded corners 190F, 192F at the sides of the boundaries i and ii to minimize stress concentrations at the boundaries i and ii.

Figure 1:
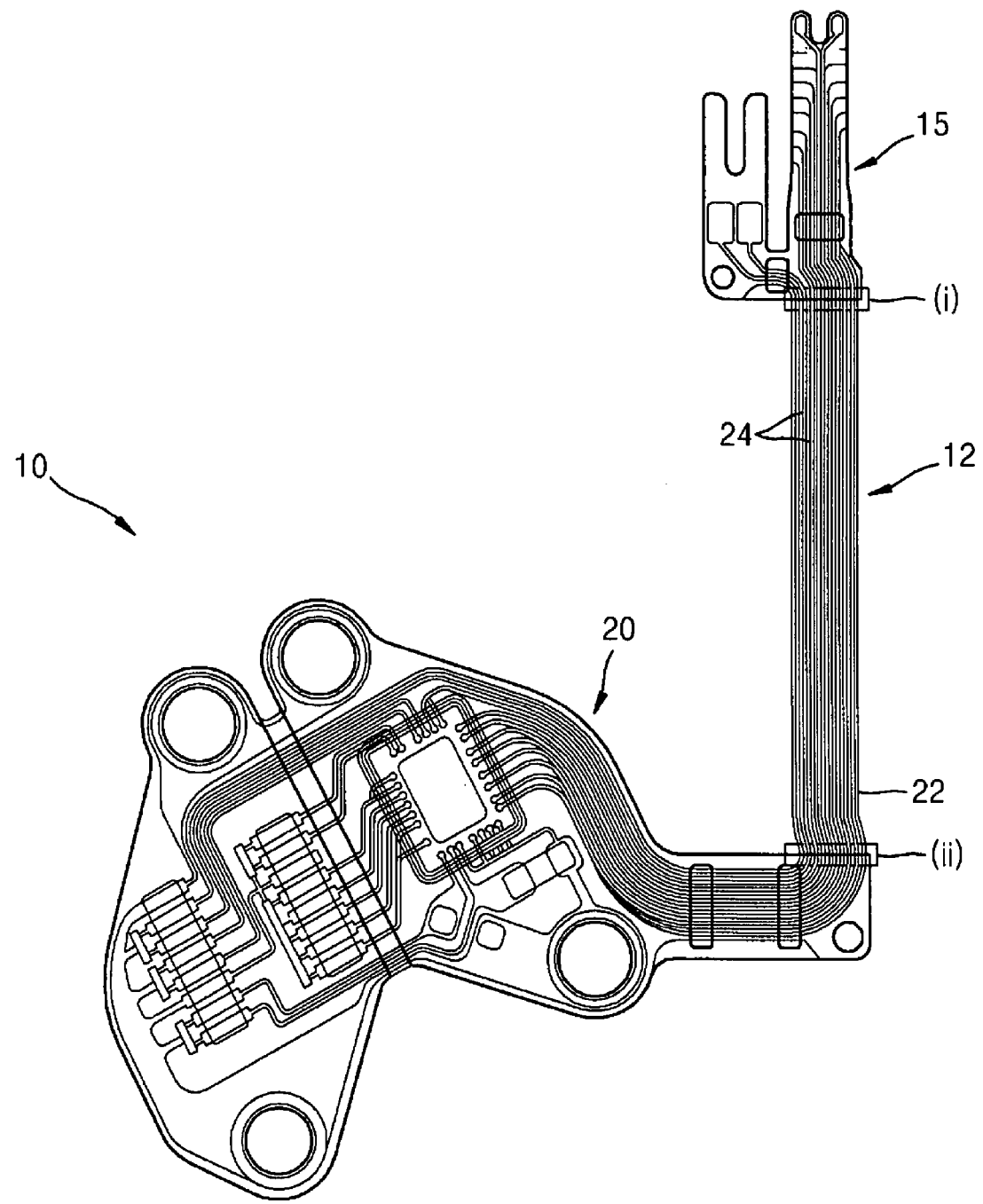
FIG. 1 is a plan view of a conventional flexible printed circuit board used in a hard disk drive (HDD)
Figure 13:
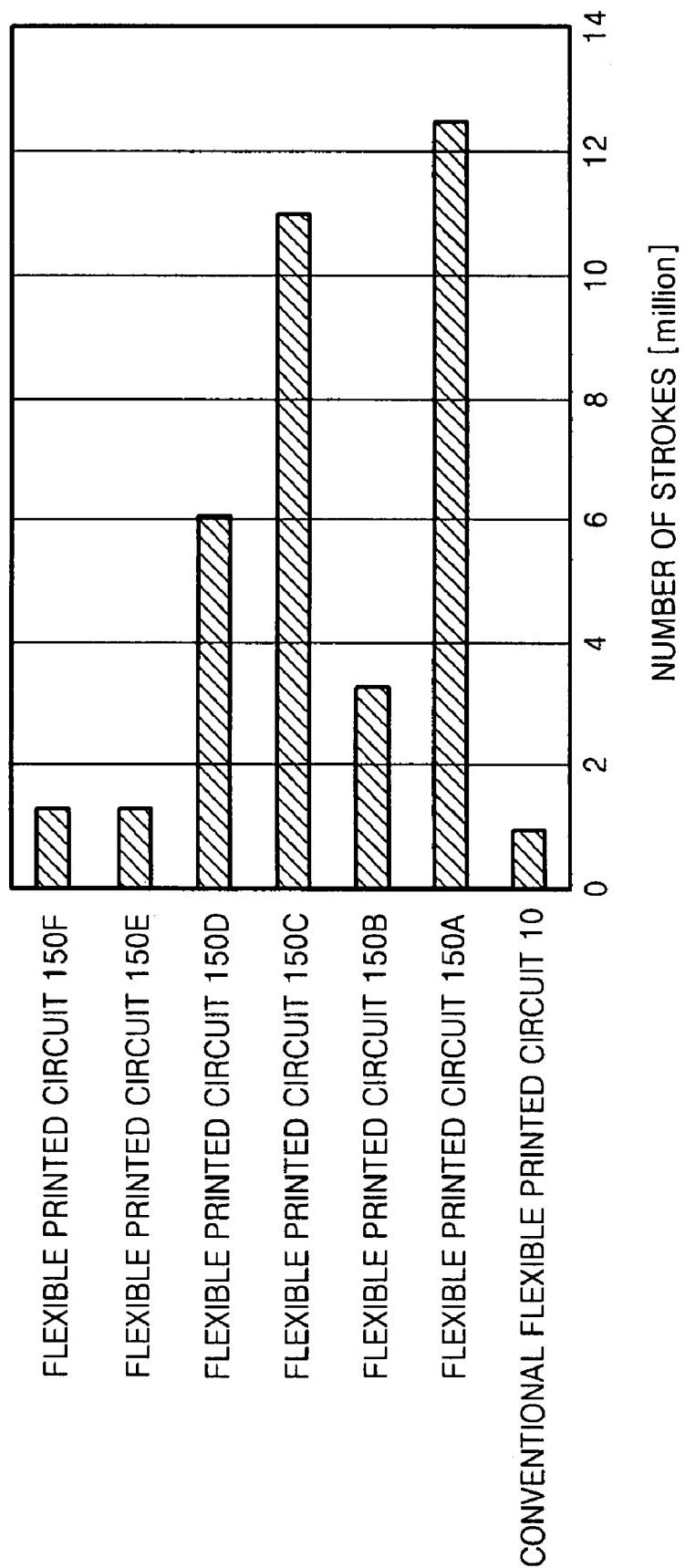
FIG. 13 is a bar graph of the number of strokes until failure for the conventional flexible printed circuit board of FIG. 1 and for the flexible printed circuit boards of FIGS. 4 through 12.

FIG. 13 is a graph comparing the conventional flexible printed circuit 10 of FIG. 1 and the flexible printed circuit boards 150A through 150F according to the present invention.

The results shown in FIG. 13 are of tests performed by mounting the conventional flexible printed circuit board 10 (FIG. 1) and the flexible printed circuit boards 150A through 150F on the HDD 100 (FIG. 2) and repeatedly pivoting the HSA 130 until the HSA 130 malfunctioned due to cracking of the flexible printed circuit board. The strokes charted in FIG. 13 refer to the repeated pivoting movements of the HSA 130 for moving the head slider 140 from the inner circumference of the disk 107 to the ramp 125.

Referring to the results shown in FIG. 13, the HSA 130 to which the conventional flexible printed circuit board 10 was connected malfunctioned after 972,000 strokes; the HSA 130 to which the flexible printed circuit board 150A was connected malfunctioned after 12,500,000 strokes; the HSA 130 to which the flexible printed circuit board 150B was connected malfunctioned after 3,248,000 strokes; the HSA 130 to which the flexible printed circuit board 150C was connected malfunctioned after 11,000,000 strokes; the HSA 130 to which the flexible printed circuit board 150D was connected malfunctioned after 6,080,000 strokes; and the HSA 130 to which each of the flexible printed circuit boards 150E and 150F were connected malfunctioned after 1,290,000 strokes. Thus, the flexible printed circuit boards 150A through 150F according to the present invention are much more resistant to cracking than the conventional flexible printed circuit board 10. Also, the crack resistance of the flexible printed circuit board 150A is rather superior to the crack resistance of the other flexible printed circuit boards.

Figure 14:
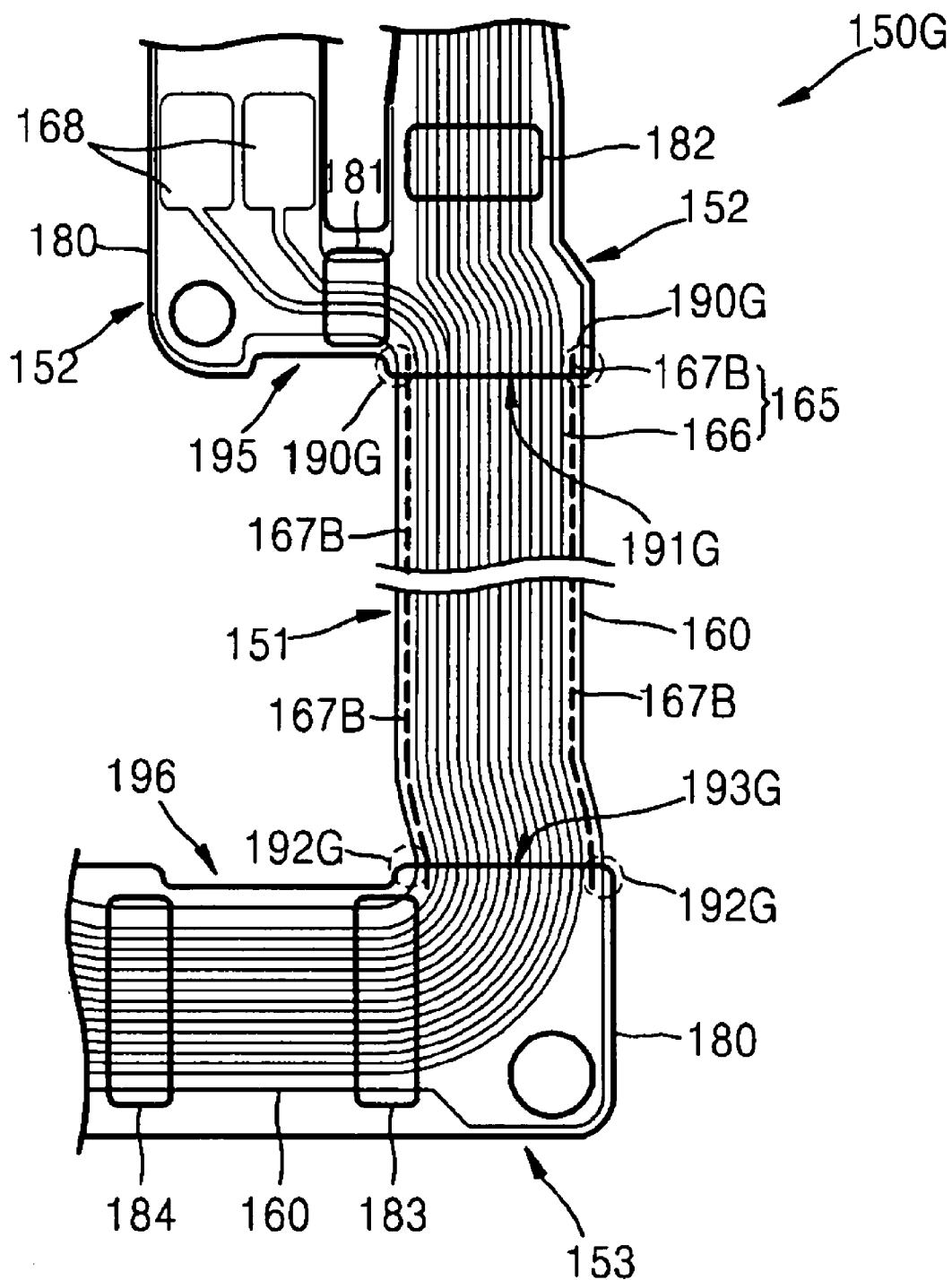
FIGS. 14 and 15 are plan views of portions of other embodiments of flexible printed circuit boards according to the present invention.
Figure 15:
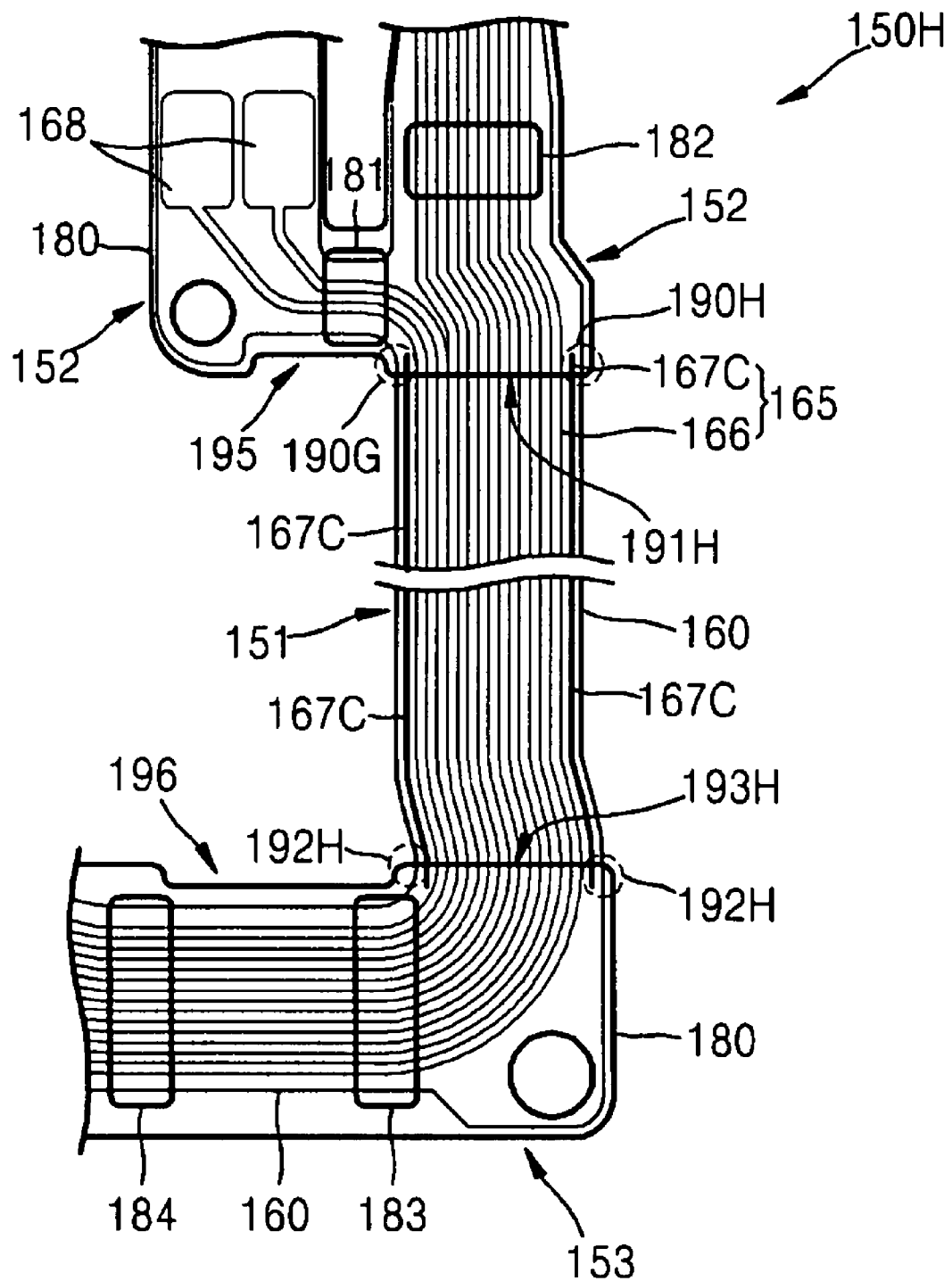

FIGS. 14 and 15 illustrate other embodiments of flexible printed circuit boards 150G and 150H according to the present invention. Elements and features of the flexible printed circuit board boards 150G and 150H which are the same as those of the flexible printed circuit board 150A are designated by the same reference numerals and thus, will not be described in further detail Referring to FIG. 14, linear edges 191G and 193G of the metal layer 180 delimit the boundaries i and ii, respectively, between the dynamic region 151 and the static regions 152 and 153. The metal layer 180 also has rounded corners 190G, 192G at the sides of the linear edges 191A and 193A to reduce stress concentrations. Dummy traces 167B each have the form of a dashed conductive line and each extends through the dynamic region 151 and across the boundaries i and ii between the dynamic region 151 and each of the static regions 152 and 153. Each of the dummy traces 167B has terminal ends adjacent the boundaries i and ii, respectively, within the static regions 152 and 153. Also, like the embodiment of FIGS. 4 and 5, the dummy traces 167B are closer to the outer peripheral edges of the sealing layer 160 than the real traces 166 are. However, the dummy traces 167B can absorb ESD more effectively than the dummy traces 167A of the embodiment of FIGS. 4 and 5.

Referring to FIG. 15, linear edges 191H and 193H of the metal layer 180 delimit the boundaries i and ii, respectively, between the dynamic region 151 and the static regions 152 and 153. The metal layer 180 also has rounded corners 190H, 192H at the sides of the linear edges 191A and 193A to reduce stress concentrations. Dummy traces 167C each have the form of a contiguous conductive line and each extends through the dynamic region 151 and across the boundaries i and ii between the dynamic region 151 and each of the static regions 152 and 153. Each of the dummy traces 167C has terminal ends adjacent the boundaries i and ii, respectively, within the static regions 152 and 153. Also, like the embodiment of FIGS. 4 and 5, the dummy traces 167C are closer to the outer peripheral edges of the sealing layer 160 than the real traces 166 are. However, the dummy traces 1 67C can absorb ESD more effectively than the dummy traces 1 67A of the embodiment of FIGS. 4 and 5.

As described above, the flexible printed circuit board according the present invention can minimize stress concentrations and fatigue at the boundaries between the dynamic region and the static regions thereof. That is, the flexible printed circuit according the present invention is highly crack resistant and thus, will not produce short-circuits and has a long useful life. Accordingly, the HSA of an HDD according to the present invention can operate without malfunctioning for a long period of time.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A flexible printed circuit board comprising: a conductive layer in the form of a circuit pattern; a sealing layer in which the conductive layer is encapsulated; and a metal layer to which the sealing layer is attached,
    wherein the flexible printed circuit board has a dynamic region made up of respective first portions of the conductive layer and the sealing layer but devoid of the metal layer, and
    static regions each made up of respective extensions of the first portions of the conductive layer and the sealing layer, and a respective portion of the metal layer, whereby the metal layer enhances the rigidity of the flexible printed circuit board at the static regions thereof and the dynamic region is more flexible than either of the static regions,
    wherein the metal layer has edges each of which delimits a boundary between the dynamic region and a respective one of the static regions, and each of said edges having a curvature to minimize stress concentrations at the boundaries between the dynamic region and each of the static regions, and
    wherein the conductive layer comprises a set of real traces through which electrical signals are transmitted by the flexible printed circuit board, and dummy traces disposed to the sides of the set of real traces, respectively, the dummy traces spanning the boundaries between the dynamic region and each of the static regions to prevent cracks from occurring at the boundaries.

2. The flexible printed circuit board of claim 1, wherein each of the dummy traces has the form of a dashed line and spans the dynamic region and the boundaries between the dynamic region and each of the static regions.

3. The flexible printed circuit board of claim 1, wherein each of the dummy traces has the form of a solid line and spans the dynamic region and the boundaries between the dynamic region and each of the static regions.

4. The flexible printed circuit board of claim 1, wherein the metal layer is of stainless steel.

5. The flexible printed circuit board of claim 1, wherein the sealing layer is of photosensitive polyimide.

6. The flexible printed circuit board of claim 1, wherein the metal layer has rounded corners at opposite sides, respectively, of each of the edges delimiting the boundaries between the dynamic region and each of the static regions such that the rounded corners minimize stress concentrations at the sides of the boundaries.

7. The flexible printed circuit board of claim 6, wherein each of the edges of the metal layer defines a concavity in the metal layer, the concavity extending between the rounded corners at the sides of a respective one of the boundaries.

8. The flexible printed circuit board of claim 6, wherein each of the edges of the metal layer defines a convexity in the metal layer, the convexity extending between the rounded corners at the sides of a respective one of the boundaries.

9. The flexible printed circuit board of claim 6, wherein each of the edges of the metal layer undulates between the rounded corners at the sides of a respective one of the boundaries.

10. The flexible printed circuit board of claim 6, wherein the metal layer has recesses in peripheral edge portions thereof, each of the recesses spanning, in the depth-wise direction of the recess, the rounded corners at the sides of a respective one of the boundaries.

11. A hard disk drive comprising:
    a data storage disk;
    a head stack assembly (HSA) including a magnetic head that writes or reads data onto or from the disk;
    a main circuit board; and
    a flexible printed circuit board electrically connecting the HSA and the main circuit board,
    wherein the flexible printed circuit comprises: a conductive layer in the form of a circuit pattern, a sealing layer in which the conductive layer is encapsulated, and a metal layer to which the sealing layer is attached,
    wherein the flexible printed circuit board has a dynamic region made up of respective first portions of the conductive layer and the sealing layer but devoid of the metal layer, and
    static regions each made up of respective extensions of the first portions of the conductive layer and the sealing layer, and a respective portion of the metal layer, whereby the metal layer enhances the rigidity of the flexible printed circuit board at the static regions thereof and the dynamic region is more flexible than either of the static regions,
    wherein the metal layer has edges each of which delimits a boundary between the dynamic region and a respective one of the static regions, and each of said edges having a curvature to minimize stress concentrations at the boundaries between the dynamic region and each of the static regions, and
    wherein the conductive layer comprises a set of real traces through which electrical signals are transmitted between the HSA and the main circuit board, and dummy traces disposed to the sides of the set of real traces, respectively, the dummy traces spanning boundaries between the dynamic region and each of the static regions to prevent cracks from occurring at the boundaries.

12. The hard disk drive of claim 11, wherein each of the dummy traces of the flexible printed circuit board has the form of a dashed line and spans the dynamic region and the boundaries between the dynamic region and each of the static regions of the flexible printed circuit board.

13. The hard disk drive circuit board of claim 11, wherein each of the dummy traces of the flexible printed circuit board has the form of a solid line and spans the dynamic region and the boundaries between the dynamic region and each of the static regions of the flexible printed circuit board.

14. The hard disk drive of claim 11, wherein the metal layer of the flexible printed circuit board is of stainless steel.

15. The hard disk drive of claim 11, wherein the sealing layer of the flexible printed circuit board is of photosensitive polyimide.

16. The hard disk drive of claim 11, wherein the metal layer has rounded corners at opposite sides, respectively, of each of the edges delimiting the boundaries between the dynamic region and each of the static regions such that the rounded corners minimize stress concentrations at the sides of the boundaries.

17. The hard disk drive of claim 16, wherein each of the curved edges defining of the metal layer defines a concavity in the metal layer, the concavity extending between the rounded corners at the sides of a respective one of the boundaries.

18. The hard disk drive of claim 16, wherein each of the edges of the metal layer defines a convexity in the metal layer, the convexity extending between the rounded corners at the sides of a respective one of the boundaries.

19. The hard disk drive of claim 16, wherein each of the edges of the metal layer undulates between the rounded corners at the sides of a respective one of the boundaries.

20. The hard disk drive of claim 16, wherein the metal layer has recesses in peripheral edge portions thereof, each of the recesses spanning, in the depth-wise direction of the recess, the rounded corners at the sides of a respective one of the boundaries.

* * * * *